United States Patent [19]
Fettweis et al.

[11] Patent Number: 5,602,767
[45] Date of Patent: Feb. 11, 1997

[54] GALOIS FIELD POLYNOMIAL MULTIPLY/DIVIDE CIRCUIT AND A DIGITAL SIGNAL PROCESSOR INCORPORATING SAME

[75] Inventors: Gerhard P. Fettweis, Dresden, Germany; Mihran Touriguian, Hercules, Calif.

[73] Assignee: TCSI Corporation, Berkeley, Calif.

[21] Appl. No.: 521,112

[22] Filed: Aug. 29, 1995

[51] Int. Cl.$^6$ .............................. G06F 7/00; G06F 15/00
[52] U.S. Cl. ..................... 364/746.1; 364/757; 364/764
[58] Field of Search .............................. 364/746.1, 754, 364/757, 761, 764; 371/37.1, 39.1

[56] References Cited

U.S. PATENT DOCUMENTS

| | | | |
|---|---|---|---|
| 4,853,887 | 8/1989 | Jutand et al. | 364/784 |
| 4,939,687 | 7/1990 | Hartley et al. | 364/757 |
| 5,095,455 | 3/1992 | Hmida et al. | 364/757 |
| 5,270,962 | 12/1993 | Fettweis | 364/766 |
| 5,341,322 | 8/1994 | Fettweis et al. | 364/764 |

*Primary Examiner*—Roy N. Envall, Jr.
*Assistant Examiner*—Ronald E. Prass, Jr.
*Attorney, Agent, or Firm*—Limbach & Limbach L.L.P.; Ronald L. Yin

[57] ABSTRACT

The multiply/divide circuit uses an exclusive OR function of an ALU in a DSP. The result of the exclusive OR function through accumulators and shift registers which recycle the shifted signals back to the ALU, can be made to perform the multiply or divide function. When used in a DSP for telecommunication purposes, the multiply/divide circuit can perform convolution encoding and cyclic redundancy check, among other functions, specifically for the telecommunication application.

30 Claims, 3 Drawing Sheets

GALOIS FIELD POLYNOMIAL MULTIPLY/DIVIDE CIRCUIT AND A DIGITAL SIGNAL PROCESSOR INCORPORATING SAME

TECHNICAL FIELD

The present invention relates to a Galois field polynomial multiply/divide circuit which can multiply or divide a first plurality of binary signals by a second plurality binary signals. The present invention also relates to a digital signal processor including such a circuit.

BACKGROUND OF THE INVENTION

Galois field polynomial multiply/divide circuits are well known in the art. In such a circuit, it is desired to multiply or divide a first plurality of binary signals by a second plurality of binary signals. Galois field multiply/divide circuits are used to calculate CRC (Cyclic Redundancy Check) bit signals in communications, as well as convolution encoding signals, among other applications.

In a typical prior art Galois field multiply/divide circuit, shift registers are used to accomplish the operation. In a typical prior art Galois field multiply circuit, a plurality of shift registers with adders and multipliers are used to accomplish the operation. In the prior art Galois field multiply circuit, each bit of a first plurality of binary signals is shifted into a shift register, multiplied by the plurality of second binary signals, added, and so forth. Hence, the operation is "serial" in nature in that at least N+1 number of clock cycles are required to accomplish the multiplication operation where N is the number of bits of the first plurality of binary signals.

Similarly, in a typical prior art Galois field divide circuit, shift registers and adders and multipliers are used to accomplish the operation. The number of shifts or cycles that is required to accomplish the operation is equal to the degree of the data of the polynomial plus 1. Again, similar to the prior art Galois field multiply circuit, the prior art Galois field divide circuit is "serial" in nature.

See, e.g. U.S. Pat. No. 5,341,322, for an example of a prior art divide circuit and U.S. Pat. No. 5,270,962 for an example of a prior art multiply/divide circuit.

SUMMARY OF THE INVENTION

In the present invention, a multiply/divide circuit receives a first plurality of binary signals and a second plurality of binary signals and performs a multiplication or a division thereof in response to a control signal. The multiply/divide circuit has means for receiving the first and second plurality of binary signals and for generating a third plurality of binary signals in response thereto. The third plurality of binary signals is the exclusive OR of said first and second plurality of binary signals and has a Most Significant Bit (MSB). A first multiplexer means receives the third plurality of binary signals and the second plurality of binary signals and generates a fourth plurality of binary signals in response to a first multiplex signal. The fourth plurality of binary signals also has a MSB. A first accumulator means receives and stores the fourth plurality of binary signals. A first shifting means receives the fourth plurality of binary signals stored in the first accumulator means and generates the second plurality of binary signals and supplies the second plurality binary signals to the receiving means. The second plurality of binary signals is the fourth plurality of binary signals shifted by one binary digit signal representing the multiplication of the fourth plurality of binary signals by 2. A first inverting means receives the MSB of the third plurality of binary signals and generates a first bit signal. A second multiplexer means receives the first bit signal and the MSB of the fourth plurality of binary signals and the control signal and generates a second bit signal in response to the control signal. A second accumulator means stores a plurality of bit signals and has a Least Significant Bit (LSB) and a MSB. The second accumulator means receives the second bit signal as the LSB and shifts the stored second bit signal by 1 digit to the MSB position. A second inverting means receives the MSB stored in the second accumulator means and generates a fourth bit signal in response thereto. A third multiplexer means receives the fourth bit signal and the MSB of the third plurality of binary signals and the control signal and generates a fifth bit signal in response to the control signal. The fifth bit signal is supplied to the first multiplexer means as the first multiplex signal. In the event the control signal controls the multiply/divide circuit to perform multiplication, the result of the multiplication operation is stored in the first accumulator means. In the event the control signal controls the multiply/divide circuit to perform division, the result of the division operation is stored in the first and second accumulator means.

The present invention also relates to the foregoing described multiply/divide circuit capable of performing multiplication only as well as the foregoing described multiply/divide circuit capable of performing division only. Finally, the present invention relates to a digital signal processor incorporating the foregoing described multiply/divide circuit.

DETAILED DESCRIPTION OF THE DRAWINGS

Figure 1:
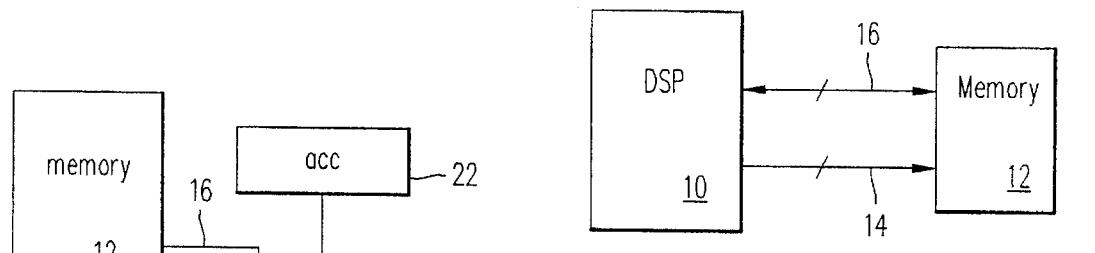
FIG. 1 is a schematic block level diagram of a Digital Signal Processor (DSP) of the present invention interacting with a memory.

Referring to FIG. 1 there is shown a block level diagram of the Digital Signal Processor (DSP) 10 of the present invention. The DSP 10 of the present invention interacts with a memory module 12 through an address bus 14 and a data bus 16. As is well known in the art, address signals are supplied along the address bus 14 to address portions of the memory 12 to either retrieve data signals therefrom to supply them to the data bus 16 into the DSP 10, or to write data signals on the data bus 16 from the DSP 10 into the addresses selected by the address bus 14.

The DSP 10 of the present invention is particularly suited for communications operations. In particular, as is well known in the art, in communications, there is the need to calculate convolution encoding signals and Cyclic Redundancy Check (CRC) signals.

Figure 2:
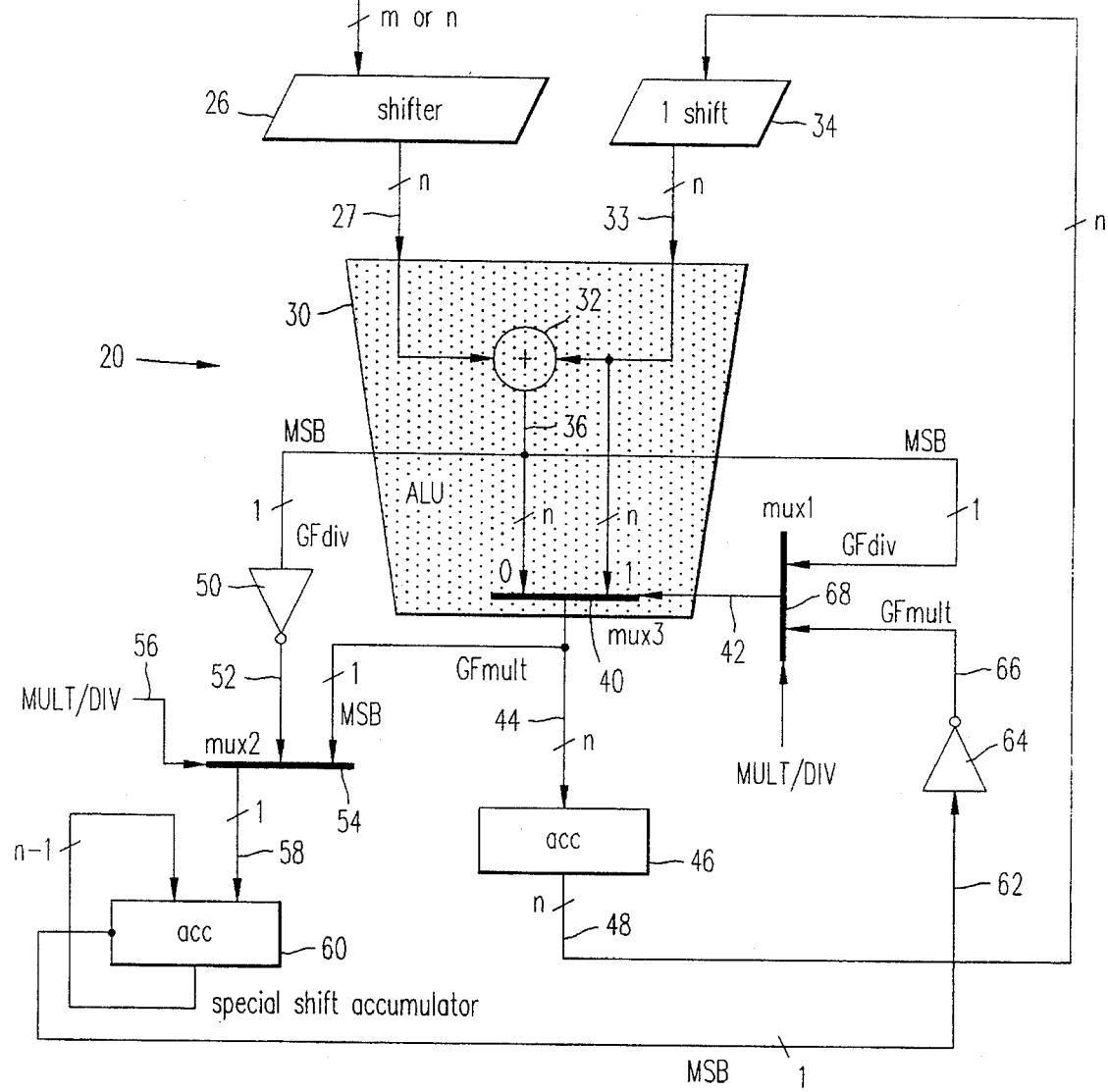
FIG. 2 is a schematic block level diagram of a multiply/divide circuit of the present invention.

Referring to FIG. 2 there is shown in schematic block level diagram a portion of the DSP 10 of the present invention incorporating the multiply/divide circuit 20 of the present invention. As is well known in the art, the DSP 10 would have other functional circuits such as instruction decode (not shown), memory address register (not shown), etc. The multiply/divide circuit 20 of the present invention comprise only a portion of the DSP 10.

As previously stated, the DSP 10 receives data signals from the data bus 16 from the memory 12 at the address locations supplied on the address bus 14. The data bus 16 supplying the data signals to the DSP 10 has a bus width of M bits. The DSP 10 comprises a first accumulator 22. The first accumulator 22 can store N bits. The M bits from the data bus 16 and the N bits from the first accumulator 22 are supplied to a first multiplexer 24. The output of the first multiplexer 24 comprising either M or N bits are supplied to a first shifter 26. In the preferred embodiment, the M bits from the data bus 16 is equal to 16. The N bits from the first accumulator 22 is equal to 40. The first shifter 26 can also store 40 bits. Hence, in the event data is supplied from the memory 12 along the data bus 16, three memory fetch operations are required to completely fill the first shifter 26. In the event the data is supplied from the first accumulator 22, the first shifter 26 can hold all of the data from the first accumulator 22 in a single load cycle. The multiply/divide circuit 20 receives the data signals from the first shifter 26. The first shifter 26, therefore, can store initially both the first plurality of binary signals as well as the second plurality of binary signals needed for operation by the multiply/divide circuit 20.

The multiply/divide circuit 20 in the preferred embodiment comprises an Arithmetic Logic Unit (ALU) 30. However, as will be seen, only a portion of the functional capability of the ALU 30 is used in the operation of the multiply/divide circuit 20. Because the multiply/divide circuit 20 is used in the DSP 10, ALUs are also used. However, as will be seen, because the multiply/divide circuit 20 need not be used in a DSP 10, only the function of the ALU 30 which is used for the operation of the multiply/divide circuit 20 needs to be provided. That function comprises an exclusive OR circuit 32. The exclusive OR circuit 32 receives a first plurality of binary signals 27 from the first shifter 26 and a second plurality of binary signals 33 from a second shifter 34 (whose function and operation will be explained in greater detail hereinafter). The output of the exclusive OR circuit 32 is a third plurality of binary signals 36. The third plurality of binary signals 36 is the exclusive OR result of the binary signals in the corresponding positions of the first and second plurality of binary signals 27 and 33. Thus, if the first plurality of binary signals 27 from the first shifter 26 comprises the following bit stream:

a b c d e

And the second plurality of binary signals 33 from the second shifter 34 comprise the following bit stream:

t u v w x

Then the output of the exclusive OR circuit 32, which is the third plurality of binary signals 36 would comprise the following:

| a | b | c | d | e |
|---|---|---|---|---|
| excl. OR t | excl. OR u | excl. OR v | excl. OR w | excl. OR x |

The third plurality of binary signals 36 would have a Most Significant Bit (MSB), comprising a single bit. The second plurality of binary signals 33 and the third plurality of binary signals 36 are supplied to a second multiplexer 40. The second multiplexer 40 lid is responsive to a first multiplex signal 42 and supplies as its output a fourth plurality of binary signals 44. The fourth plurality of binary signals 44 is supplied to a second accumulator 46 for storage. In addition, the fourth plurality of binary signals 44 also has a Most Significant Bit (MSB).

A fifth plurality of binary signals 48 comprises the output of the second accumulator 46. The fifth plurality of binary signals 48 is supplied to the second shifter 34. The second shifter 34 receives the fifth plurality of binary signals 48 and shifts it one binary digit to the left or to the most significant position, which represents the multiplication of the fifth plurality of binary signals 48 by 2. The output of the second shifter 34 is the second plurality of signals 33 which, as previously stated is supplied to the exclusive OR circuit 32.

The MSB of the third plurality of binary signals is inverted by a first inverter 50, producing a first bit signal 52 as its output. The MSB of the fourth plurality of binary signals 44, and the first bit signal 52 are supplied to a third multiplexer 54. The third multiplexer 54 is controlled by a multiply/divide control signal 56 which commands the multiply/divide circuit 20 to perform either the function of multiplication or the function of division. In response thereto, the output of the third multiplexer 54 is a second bit signal 58. The second bit signal 58 is supplied to the Least Significant Bit (LSB) position of a third accumulator 60. The LSB or the Least Significant Bit position is in general the right most bit position. The third accumulator 60 also can store N bits of binary signals. The N bits of the third accumulator 60 comprise: N, N–1, N–2, . . . 1. The third accumulator 60 takes as its output the binary signals stored in the position: N–1, N–2 . . . 1 and loads those binary signals back into the third accumulator 60 in the positions of: N, N–1, N–2 . . . 2. This loading of the output of the third accumulator 60 back into itself occurs after each loading of the second bit signal 58 into the LSB position. Therefore, by this operation, the affect of loading the second bit signal 58 into the LSB position of the third accumulator 60 followed by the loading of the N–1 bit from the third accumulator 60 back onto itself is to shift the second bit signal 58 loaded into the LSB position by one binary position towards the MSB position.

The MSB signal of the third accumulator 60 is supplied as a third bit signal 62 to a second inverter 64, producing as its output a fourth bit signal 66. The fourth bit signal 66 and the MSB of the third plurality of binary signals 36 are supplied to a fourth multiplexer 68. The fourth multiplexer 68 is controlled by the same multiply/divide control signal 56 that controls the third multiplexer 54. The output of the fourth multiplexer 68 is the first multiplex signal 42 which is used to control the second multiplexer 40.

Figure 3:
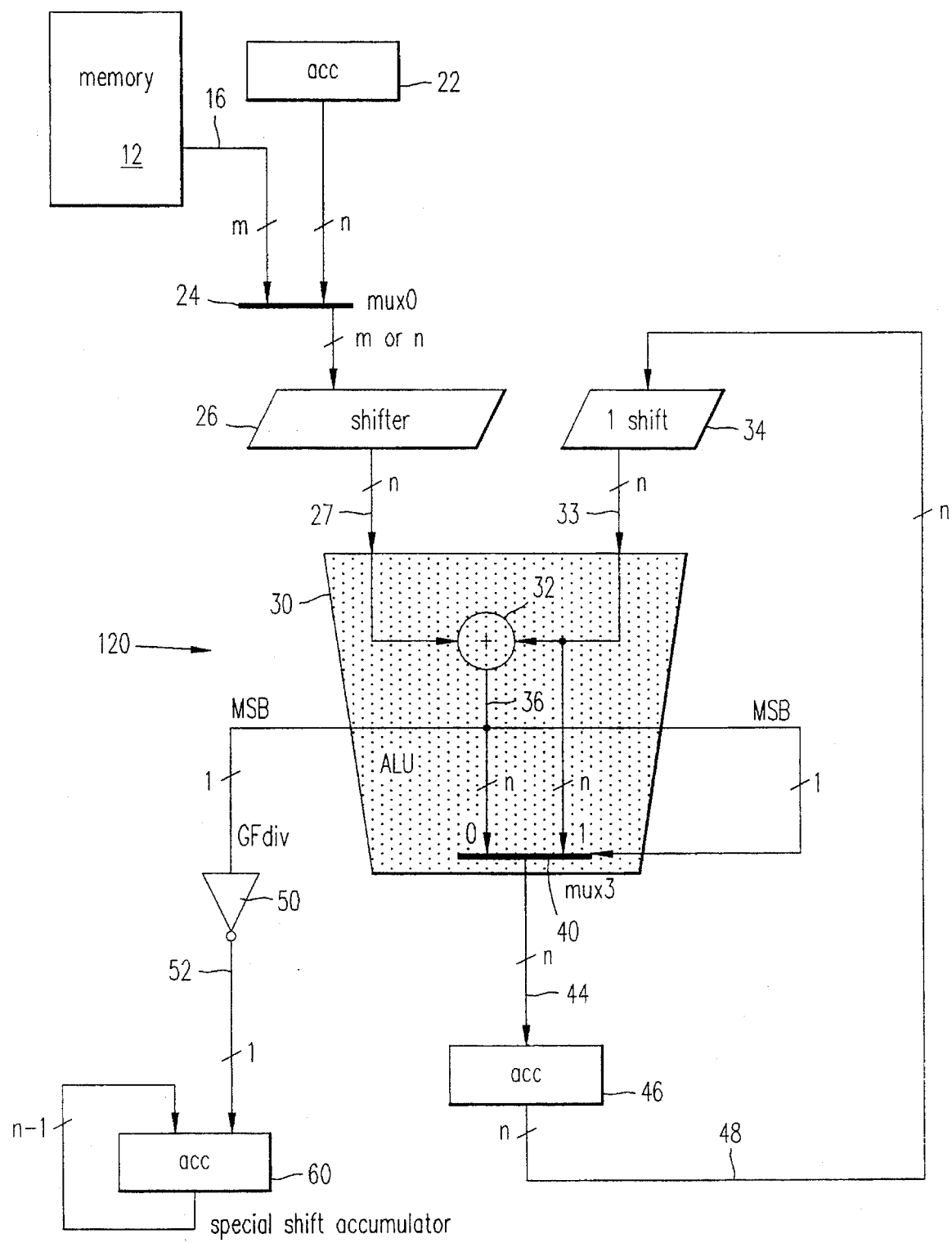
FIG. 3 is a schematic block level diagram of a divide circuit of the present invention.
Figure 4:
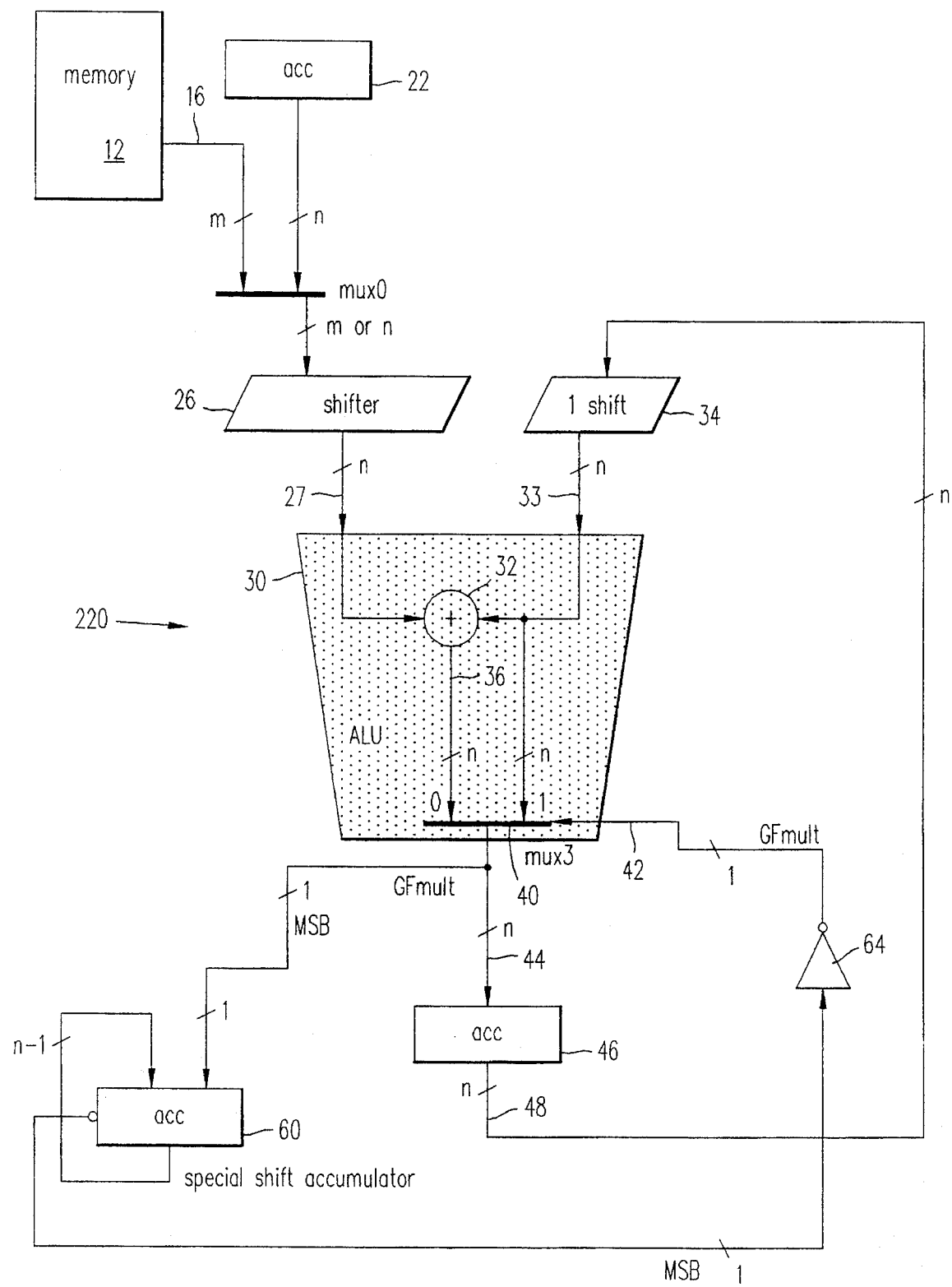
FIG. 4 is a schematic block level diagram of a multiply circuit of the present invention.

The function of the multiply/divide control signal 56 in controlling the multiply/divide circuit 20 to operate either in a multiplication mode or a division operation can best be understood by referring to FIGS. 3 and 4. FIG. 3 shows a dedicated divide circuit 120. Functionally the divide circuit 120 operates the same as the multiply/divide circuit 20 when the multiply/divide control signal 56 is set in the division operation mode.

Similar to the multiply/divide circuit 20 described and shown in FIG. 2, the divide circuit 120 shown in FIG. 3 can be used as a part of the DSP 10. In that connection, the DSP 10 would receive the first and second plurality of binary signals supplied from either the memory 12 or the first accumulator 22 and shifted through a first multiplexer 24 into a first shifter 26. The first plurality of binary signals 27 from the first shifter 26 are supplied to an ALU 30 which comprises an exclusive OR circuit 32. The exclusive OR circuit 32 receives as its second plurality of binary signals 33 from the second shifter 34. The output of the exclusive OR circuit 32 is a third plurality of binary signals 36.

The third plurality of binary signals 36 has an MSB signal. The second plurality of binary signals 33 and the third plurality of binary signals 36 are supplied to a second multiplexer 40 which is controlled by the MSB binary signal of the third plurality of binary signals 36. The output of the second multiplexer 40 is a fourth plurality of binary signals 44 which is supplied to a second accumulator 46 for storage. A fifth plurality of binary signals is from the output of the second accumulator 46 and is supplied to the second shifter 34. The second shifter 34 receives the fifth plurality of binary signals 48 and shifts it by one binary position to the left or to the most significant position, thereby affecting the multiplication of the fifth binary signals by 2. The result of the second shifter 34 is the second plurality of binary signals 33 which is supplied to the exclusive OR circuit 32 of the ALU 30.

The MSB binary signal of the third plurality of binary signals 36 is supplied to a first inverter 50 producing a first bit signal 52 as its output thereof. The first bit signal 52 is supplied to the least significant bit position of the third accumulator 60. The binary signals stored in the position of N–1, N–2 . . . 1 from the third accumulator 60 are supplied back to the third accumulator 60 in the position of: N, N–1 . . . 2, thereby affecting a shift of the second bit signal stored in the least significant bit position of the third accumulator 60 by 1 to the MSB position.

The result of the division operation is the quotient stored in the third accumulator 60, and the remainder stored in the second accumulator 46.

Similarly, in the event the multiply/divide control signal 56 is set to affect a multiply operation on the multiply/divide circuit 20, the resulting dedicated multiply circuit is shown in FIG. 4. The dedicated multiply circuit 220 can be used in a stand alone mode or as part of the DSP 10. The multiply circuit 220 comprises an ALU 30 in the event the multiply circuit 220 is used as part of the DSP 10. The ALU 30 receives a first plurality of binary signals 27 from the first shifter 26, and a second plurality of binary signals 33 from the second shifter 34. The ALU 30 comprises an exclusive OR circuit 32 which receives the first plurality of binary signals 27 and the second plurality of binary signals 33 and generates as its output a third plurality of binary signals 36, which is the exclusive OR of the corresponding bit signals in the first and second plurality of binary signals 27 and 33. The second plurality of binary signals 33 and the third plurality of binary signals 36 are supplied to a second multiplexer 40. The second multiplexer 40 is controlled by a first multiplex signal 42, and generates as its output a fourth plurality of binary signals 44. The fourth plurality of binary signals 44 has a MSB binary signal associated therewith.

The fourth plurality of binary signals 44 is supplied to a second accumulator 46 for storage. A fifth plurality of binary signals 48 is the output of the second accumulator 46. The fifth plurality of binary signals 48 is supplied to the second shifter 34 which shifts the fifth plurality of binary signals 48 by one binary bit position to the MSB position, thereby affecting a multiplication of 2. The output of the second shifter 34 is the second plurality of binary signals 33 which is supplied to the ALU 30.

The MSB binary signal of the fourth plurality of binary signals 44 is supplied to the least significant bit position of the third accumulator 60. The N–1 binary signals from the position of: N–1, N–2 . . . 1 of the third accumulator 60 are supplied back to the third accumulator 60 and stored in the N, N–1 . . . 2 binary positions of the third accumulator 60. This provides a shifting of the signal stored in the least significant bit position by 1 to the left or to the MSB position. The MSB binary signal of the third accumulator 60 is supplied to a second inverter 64 which generates as its output the first multiplex signal 42 which is used to control the second multiplexer 40.

The result of the multiplication operation is stored in the third accumulator 60.

The theory of operation of the present invention is as follows. In the event the multiply/divide circuit 20 shown in FIG. 2 is to operate in the multiply mode, the multiply/divide control signal 56 is sent to the third multiplexer 54, and the fourth multiplexer 68 to control the flow of signals thereof such that it results in the function or circuit shown in FIG. 4. The first polynomial binary signal is either retrieved from memory 12 or from the first accumulator 22 and is supplied through the exclusive OR circuit 32 and is stored in the second accumulator 46. The first polynomial binary signal from the second accumulator 46 is then shifted by one bit by the second shifter 34 and is supplied as the second plurality of binary signals 33 to the exclusive OR circuit 32. The second polynomial binary signal is also retrieved from memory 12 or the first accumulator 22 and is supplied through the first shifter 26 and is supplied as the first plurality of binary signals 27 to the exclusive OR circuit 32. The result of the operation of exclusive OR of the first and second plurality of binary signals 27 and 33 is the third plurality of binary signal 36 with its MSB bit loaded into the LSB position of the third accumulator 60. As each MSB signal of the third plurality of binary signals 36 is generated by the exclusive OR circuit 32, each new MSB signal is supplied to the LSB position of the third accumulator 60. After N+1 operations, the result, stored in the third accumulator 60 is the multiplication of the first and second plurality of binary signals 27 and 33 in accordance with the following theoretical basis:

MULTIPLICATION OF POLYNOMIALS

Multiplication of polynomials is just like ordinary multiplication, except that addition of coefficients is accomplished with the Exclusive OR operation.

Example #1

$$x \frac{\begin{array}{r} X^3 \\ X^3 + X + 1 \end{array}}{X^6 + X^4 + X^3} \quad \text{OR} \quad x \frac{\begin{array}{r} 1000 \\ 1011 \end{array}}{\begin{array}{r} 1000 \\ 1000 \\ \underline{1000} \\ 1011000 \end{array}}$$

Example #2

$$x \frac{\begin{array}{r} X + 1 \\ X^3 + X + 1 \end{array}}{\begin{array}{r} X^4 + X^3 \\ X^2 + X \\ \underline{X + 1} \\ X^4 + X^3 + X^2 + 1 \end{array}} \quad \text{OR} \quad \frac{\begin{array}{r} 11 \\ x\,1011 \end{array}}{\begin{array}{r} 11 \\ 11 \\ \underline{11} \\ 11101 \end{array}}$$

In this Example #2, unlike real number multiplication, the two 'X' terms or the two '1' terms cancel.

The multiply/divide circuit 20 when operating in the multiplication mode has particular application in the communications area when it is desired to perform a convolution encoding operation of the first plurality of binary signals 27 convolution encoded by the second plurality of binary signals 33.

When it is desired to operate the multiply/divide circuit 20 in a division mode, the multiply/divide control signal 56 is supplied to the third multiplexer 54 and the fourth multiplexer 68 so that the resultant hardware circuit functions substantially in accordance with the embodiment shown in FIG. 3. In this embodiment, the second plurality of binary signals or the divisor is retrieved from the memory 12 or the accumulator 22 and is stored in the second accumulator 46. The second plurality of binary signals is supplied to the second shifter 34 to generate the second plurality of binary signals 33. The first plurality of binary signals is also retrieved from memory 12 or from the accumulator 22 and is supplied as the first plurality of binary signals 27 to the exclusive OR circuit 32, as the divisor. The result of the operation of the second plurality of binary signals 33, divided by the first plurality of binary signals 27 is a plurality of binary signals stored in the third accumulator 60, as the quotient with the remainder stored in the second accumulator 46. The theory of operation is as follows:

DIVISION OF POLYNOMIALS

Division of polynomials is just like ordinary division, except that addition of coefficients is accomplished with the Exclusive OR operation.

Example #1

$$X^3+X+1 \enspace \overline{\left) \begin{array}{l} X^2+1 \\ X^5+1 \\ \underline{X^5+X^3+X^2} \\ X^3+X^2+1 \\ \underline{X^3+X\phantom{^2}+1} \\ X^2+X \end{array}\right.} \qquad \text{OR} \qquad 1011 \enspace \overline{\left) \begin{array}{l} 101 \\ 100001 \\ \underline{1011} \\ 1101 \\ \underline{1011} \\ 0110 \end{array}\right.}$$

Example #2

$$X^3+X+1 \enspace \overline{\left) \begin{array}{l} X^2+1 \\ X^5+X^2+1 \\ \underline{X^5+X^3+X^2} \\ X^3+1 \\ \underline{X^3+X\phantom{^2}+1} \\ X \end{array}\right.} \qquad 1011 \enspace \overline{\left) \begin{array}{l} 101 \\ 100101 \\ \underline{1011} \\ 1001 \\ \underline{1011} \\ 0010 \end{array}\right.}$$

In the event the multiply/divide circuit 20 is used in telecommunication applications, the divide circuit 220 finds particular use in calculating CRC of the second plurality of binary signals 33 as checked by the first plurality of binary signals 27 with the CRC signals being stored in the second accumulator 46. In that event, the result of a quotient stored in the third accumulator 60 is not used.

As can be seen from the foregoing, the multiply/divide circuit is compact and when used with an ALU in a DSP, it has particular application in the telecommunications field.

What is claimed is:

1. A multiplier/divider circuit for receiving a first plurality of binary signals and a second plurality of binary signals and for performing a multiplication or a division thereof in response to a control signal, said apparatus comprising:

means for receiving said first and second plurality of binary signals and for generating a third plurality of binary signals in response thereto, said third plurality of binary signals being the exclusive OR of said first and second plurality of binary signals, said third plurality of binary signals having a Most Significant Bit (MSB);

first multiplexer means for receiving said third plurality of binary signals and said second plurality of binary signals and for generating a fourth plurality of binary signals in response to a first multiplex signal, said fourth plurality of binary signals having a MSB;

first accumulator means for receiving and storing said fourth plurality of binary signals;

first shifting means for receiving said fourth plurality of binary signals stored in said first accumulator means and for generating said second plurality of binary signals and for supplying said second plurality of binary signals to said receiving means; said second plurality of binary signals being said fourth plurality of binary signals shifted by one binary digit signal representing the multiplication of said fourth plurality of binary signals by two;

first inverting means for receiving said MSB of said third plurality of binary signals and for generating a first bit signal;

second multiplexer means for receiving said first bit signal and said MSB of said fourth plurality of binary signals, and said control signal, and for generating a second bit signal in response to said control signal;

second accumulator means for storing a plurality of bit signals and having a Least Significant Bit (LSB) and a MSB, and for receiving said second bit signal as said LSB, for shifting said stored second bit signal by one digit to said MSB;

second inverting means for receiving said MSB stored in said second accumulator means, and for generating a fourth bit signal in response thereto;

third multiplexer means for receiving said fourth bit signal and said MSB of said third plurality of binary signals and said control signal and for generating a fifth bit signal in response to said control signal; and means for supplying said fifth bit signal to said first multiplexer means as said first multiplex signal;

wherein the result of said multiplication operation is stored in said first accumulator means and the result of said division operation is stored in said first and second accumulator means.

2. The circuit of claim 1 wherein said circuit performs a Galois field division operation in response to said control signal directing a division operation.

3. The circuit of claim 2 wherein the quotient result of said division operation is stored in said second accumulator means and the remainder result of said division operation is stored in said first accumulator means.

4. The circuit of claim 2 wherein said circuit performs a CRC calculation wherein the result of said CRC calculation is stored in said first accumulator means.

5. The circuit of claim 1 wherein said circuit performs a Galois field multiplication in response to said control signal directing a multiplication operation.

6. The circuit of claim 5 wherein said circuit performs a convolution encoding operation with the result of said encoding operation stored in said first accumulator means.

7. A multiplication circuit for performing a multiplication operation on a first plurality of binary signals multiplied by a second plurality of binary signals, said circuit comprising:

means for receiving said first and second plurality of binary signals and for generating a third plurality of binary signals in response thereto, said third plurality of binary signals being the exclusive OR of said first and second plurality of binary signals;

first multiplexer means for receiving said third plurality of binary signals and said second plurality of binary signals and for generating a fourth plurality of binary signals in response to a first multiplex signal, said fourth plurality of binary signals having a Most Significant Bit (MSB);

first accumulator means for receiving and storing said fourth plurality of binary signals;

first shifting means for receiving said fourth plurality of binary signals stored in said first accumulator means and for generating said second plurality of binary signals and for supplying said second plurality of binary signals to said receiving means; said second plurality of binary signals being said fourth plurality of binary signals shifted by one binary digit signal representing the multiplication of said fourth plurality of binary signals by two;

second accumulator means for storing a plurality of bit signals and having a Least Significant Bit (LSB) and a MSB, and for receiving said MSB of said fourth plurality of binary signals as said LSB, for shifting said stored LSB bit signal by one digit to said MSB;

second inverting means for receiving said MSB stored in said second accumulator means, and for generating a fourth bit signal in response thereto;

said fourth bit signal supplied to said first multiplexer means as said first multiplex signal;

wherein the result of said multiplication operation is stored in said first accumulator.

8. The circuit of claim 7 wherein said circuit performs a Galois field multiplication.

9. The circuit of claim 8 wherein said circuit performs a convolution encoding operation with the result of said encoding operation stored in said first accumulator means.

10. A division circuit for performing a division operation by dividing a first plurality of binary signals by a second plurality of binary signals said circuit comprising:

means for receiving said first and second plurality of binary signals and for generating a third plurality of binary signals in response thereto, said third plurality of binary signals being the exclusive OR of said first and second plurality of binary signals, said third plurality of binary signals having a Most Significant Bit (MSB);

first multiplexer means for receiving said third plurality of binary signals and said second plurality of binary signals and for generating a fourth plurality of binary signals in response to a said MSB of said third plurality of binary signals;

first accumulator means for receiving and storing said fourth plurality of binary signals;

first shifting means for receiving said fourth plurality of binary signals stored in said first accumulator means and for generating said second plurality of binary signals and for supplying said second plurality of binary signals to said receiving means; said second plurality of binary signals being said fourth plurality of binary signals shifted by one binary digit signal representing the multiplication of said fourth plurality of binary signals by two;

first inverting means for receiving said MSB of said third plurality of binary signals and for generating a first bit signal;

second accumulator means for storing a plurality of bit signals and having a Least Significant Bit (LSB) and a MSB, and for receiving said first bit signal as said LSB, for shifting said stored first bit signal by one digit to said MSB;

wherein the result of said dividing operation is stored in said first accumulator means and second accumulator means.

11. The circuit of claim 10 wherein said circuit performs a Galois field division operation.

12. The circuit of claim 11 wherein the quotient result of said division operation is stored in said second accumulator means and the remainder result of said division operation is stored in said second accumulator means.

13. The circuit of claim 11 wherein said circuit performs a CRC calculation wherein the result of said CRC calculation is stored in said first accumulator means.

14. A CRC calculation circuit for calculating the CRC of a first plurality of binary signals by dividing said first plurality of binary signals by a second plurality of binary signals, said circuit comprising:

means for receiving said first and second plurality of binary signals and for generating a third plurality of binary signals in response thereto, said third plurality of binary signals being the exclusive OR of said first and second plurality of binary signals, said third plurality of binary signals having a Most Significant Bit (MSB);

first multiplexer means for receiving said third plurality of binary signals and said second plurality of binary signals and for generating a fourth plurality of binary signals in response to a said MSB of said third plurality of binary signals;

first accumulator means for receiving and storing said fourth plurality of binary signals; and first shifting means for receiving said fourth plurality of binary signals stored in said first accumulator means and for generating said second plurality of binary signals and for supplying said second plurality of binary signals to said receiving means; said second plurality of binary signals being said fourth plurality of binary signals shifted by one binary digit signal representing the multiplication of said fourth plurality of binary signals by two;

wherein the result of said calculation is stored in said first accumulator means.

15. A digital signal processor for performing a multiplication or a division operation, in response to a control signal, on a first plurality of binary signals and a second plurality of binary signals, said processor comprising:

memory means for storing said first and second plurality of binary signals;

ALU means for receiving said stored first and second plurality of binary signals, and for generating a third plurality of binary signals in response thereto, said third plurality of binary signals being the exclusive OR of said first and second plurality of binary signals, said third plurality of binary signals having a Most Significant Bit (MSB);

said ALU means further comprising a first multiplexer means for receiving said third plurality of binary signals and said second plurality of binary signals and for generating a fourth plurality of binary signals in response to a first multiplex signal, said fourth plurality of binary signals having a MSB;

first accumulator means for receiving and storing said fourth plurality of binary signals;

first shifting means for receiving said fourth plurality of binary signals stored in said first accumulator means and for generating said second plurality of binary signals and for supplying said second plurality of binary signals to said receiving means; said second plurality of binary signals being said fourth plurality of binary signals shifted by one binary digit signal representing the multiplication of said fourth plurality of binary signals by two;

first inverting means for receiving said MSB of said third plurality of binary signals and for generating a first bit signal;

second multiplexer means for receiving said first bit signal and said MSB of said fourth plurality of binary signals, and said control signal, and for generating a second bit signal in response to said control signal;

second accumulator means for storing a plurality of bit signals and having a Least Significant Bit (LSB) and a MSB, and for receiving said second bit signal as said LSB, for shifting said stored second bit signal by one digit to said MSB;

second inverting means for receiving said MSB stored in said second accumulator means, and for generating a fourth bit signal in response thereto;

third multiplexer means for receiving said fourth bit signal and said MSB of said third plurality of binary signals and said control signal and for generating a fifth bit signal in response to said control signal; and means for supplying said fifth bit signal to said first multiplexer means as said first multiplex signal;

wherein the result of said multiplication operation is stored in said first accumulator means and the result of said division operation is stored in said first and second accumulator means.

16. The processor of claim 15 wherein said processor performs a Galois field division operation in response to said control signal directing a division operation.

17. The processor of claim 16 wherein the quotient result of said division operation is stored in said second accumulator means and the remainder result of said division operation is stored in said first accumulator means.

18. The processor of claim 16 wherein said processor performs a CRC calculation wherein the result of said CRC calculation is stored in said first accumulator means.

19. The processor of claim 15 wherein said processor performs a Galois field multiplication in response to said control signal directing a multiplication operation.

20. The processor of claim 19 wherein said processor performs a convolution encoding operation with the result of said encoding operation stored in said first accumulator means.

21. A digital signal processor for performing a multiplication operation on a first plurality of binary signals multiplied by a second plurality of binary signals, said processor comprising:

memory means for storing said first and second plurality of binary signals;

ALU means for receiving said stored first and second plurality of binary signals and for generating a third plurality of binary signals in response thereto, said third plurality of binary signals being the exclusive OR of said first and second plurality of binary signals;

said ALU means further comprising first multiplexer means for receiving said third plurality of binary signals and said second plurality of binary signals and for generating a fourth plurality of binary signals in response to a first multiplex signal, said fourth plurality of binary signals having a Most Significant Bit (MSB);

first accumulator means for receiving and storing said fourth plurality of binary signals;

first shifting means for receiving said fourth plurality of binary signals stored in said first accumulator means and for generating said second plurality of binary signals and for supplying said second plurality of binary signals to said receiving means; said second plurality of binary signals being said fourth plurality of binary signals shifted by one binary digit signal representing the multiplication of said fourth plurality of binary signals by two;

second accumulator means for storing a plurality of bit signals and having a Least Significant Bit (LSB) and a MSB, and for receiving said MSB of said fourth plurality of binary signals as said LSB, for shifting said stored LSB bit signal by one digit to said MSB;

second inverting means for receiving said MSB stored in said second accumulator means, and for generating a fourth bit signal in response thereto;

said fourth bit signal supplied to said first multiplexer means as said first multiplex signal;

wherein the result of said multiplication operation is stored in said first accumulator.

22. The processor of claim 21 wherein said processor performs a Galois field multiplication.

23. The processor of claim 22 wherein said processor performs a convolution encoding operation with the result of said encoding operation stored in said first accumulator means.

24. A digital signal processor for performing a division operation by dividing a first plurality of binary signals by a second plurality of binary signals said processor comprising:

memory means for storing said first and second plurality of binary signals;

ALU means for receiving said stored first and second plurality of binary signals and for generating a third plurality of binary signals in response thereto, said third plurality of binary signals being the exclusive OR of said first and second plurality of binary signals, said third plurality of binary signals having a Most Significant Bit (MSB);

said ALU means further comprising first multiplexer means for receiving said third plurality of binary signals and said second plurality of binary signals and for generating a fourth plurality of binary signals in response to a said MSB of said third plurality of binary signals;

first accumulator means for receiving and storing said fourth plurality of binary signals;

first shifting means for receiving said fourth plurality of binary signals stored in said first accumulator means and for generating said second plurality of binary signals and for supplying said second plurality of binary signals to said receiving means; said second plurality of binary signals being said fourth plurality of binary signals shifted by one binary digit signal representing the multiplication of said fourth plurality of binary signals by two;

first inverting means for receiving said MSB of said third plurality of binary signals and for generating a first bit signal;

second accumulator means for storing a plurality of bit signals and having a Least Significant Bit (LSB) and a MSB, and for receiving said first bit signal as said LSB, for shifting said stored first bit signal by one digit to said MSB;

wherein the result of said dividing operation is stored in said first accumulator means and second accumulator means.

25. The processor of claim 24 wherein said processor performs a Galois field division operation.

26. The processor of claim 25 wherein the quotient result of said division operation is stored in said second accumulator means and the remainder result of said division operation is stored in said second accumulator means.

27. The processor of claim 25 wherein said processor performs a CRC calculation wherein the result of said CRC calculation is stored in said first accumulator means.

28. A digital signal processor for calculating the CRC of a first plurality of binary signals by dividing said first plurality of binary signals by a second plurality of binary signals, said processor comprising:

memory means for storing said first and second plurality of binary signals;

ALU means for receiving said stored first and second plurality of binary signals and for generating a third plurality of binary signals in response thereto, said third plurality of binary signals being the exclusive OR of said first and second plurality of binary signals, said third plurality of binary signals having a Most Significant Bit (MSB);

said ALU means further comprising first multiplexer means for receiving said third plurality of binary signals and said second plurality of binary signals and for generating a fourth plurality of binary signals in response to a said MSB of said third plurality of binary signals;

first accumulator means for receiving and storing said fourth plurality of binary signals; and first shifting means for receiving said fourth plurality of binary signals stored in said first accumulator means and for generating said second plurality of binary signals and for supplying said second plurality of binary signals to said receiving means; said second plurality of binary signals being said fourth plurality of binary signals shifted by one binary digit signal representing the multiplication of said fourth plurality of binary signals by two;

wherein the result of said calculation is stored in said first accumulator means.

29. A method of performing a multiplication operation on a first plurality of binary signals multiplied by a second plurality of binary signals, comprising:

a) performing an exclusive OR of corresponding bit signals of said first and second plurality of binary signals to produce a third plurality of binary signals;

b) multiplexing said third plurality of binary signals and said second plurality of binary signals and generating a fourth plurality of binary signals in response to a first multiplex signal, said fourth plurality of binary signals having a Most Significant Bit (MSB);

c) storing said fourth plurality of binary signals in a first storage means;

d) shifting said fourth plurality of binary signals by one binary digit to the most significant position, to generate said second plurality of binary signals and reverting to step (a);

e) storing said MSB of said fourth plurality of binary signals in the Least Significant Bit (LSB) position of a second storage means;

f) shifting said LSB bit signal stored in said second storage means by one digit to the MSB position;

g) inverting said MSB stored in said first storage means, to generate a fourth bit signal in response thereto;

h) supplying said fourth bit signal to said first multiplexer means as said first multiplex signal;

wherein the result of said multiplication operation is stored in said second storage means.

30. A method of performing a division operation by dividing a first plurality of binary signals by a second plurality of binary signals said method comprising:

a) performing an exclusive OR of corresponding bit signals of said first and second plurality of binary signals to produce a third plurality of binary signals, having a most Significant Bit (MSB);

b) multiplexing said third plurality of binary signals and said second plurality of binary signals and generating a fourth plurality of binary signals in response to a first multiplex signal;

c) storing said fourth plurality of binary signals in a first storage means;

d) shifting said fourth plurality of binary signals by one binary digit to the most significant position, to generate said second plurality of binary signals and reverting to step (a);

e) inverting said MSB of said third plurality of binary signals to generate a first bit signal;

f) storing said first bit signal in the Least Significant Bit (LSB) position of a second storage means;

g) shifting said LSB bit signal stored in said second storage means by one digit to the MSB position;

wherein the result of said dividing operation is stored in said first storage means and second storage means.

* * * * *